United States Patent [19]

Matsui et al.

[11] Patent Number: 4,749,421
[45] Date of Patent: Jun. 7, 1988

[54] METHOD FOR MANUFACTURING MONOLITHIC CERAMIC ELECTRONIC COMPONENTS

[75] Inventors: Kenji Matsui; Kenichi Mizuno; Yukio Tanaka, all of Nagaokakyo, Japan

[73] Assignee: Murata Manufacturing Co., Ltd., Japan

[21] Appl. No.: 813,707

[22] Filed: Dec. 27, 1985

[30] Foreign Application Priority Data

Dec. 29, 1984 [JP] Japan .................. 59-280363

[51] Int. Cl.$^4$ .................. C04B 35/64; C04B 41/90; B32B 31/20; B32B 31/26
[52] U.S. Cl. .................. 156/89; 29/25.42; 156/276; 156/286; 264/61; 264/62; 264/570
[58] Field of Search .............. 156/182, 276, 285, 286, 156/288, 312, 382, 497, 89, 87, 323, 381; 264/61, 62, 570; 29/25.42

[56] References Cited

U.S. PATENT DOCUMENTS

| | | | |
|---|---|---|---|
| 3,538,572 | 11/1970 | Lull | 29/25.42 |
| 3,604,082 | 10/1968 | McBrayer | 156/89 |
| 3,714,706 | 2/1973 | Reizman | 156/89 |
| 3,745,082 | 7/1973 | Packard | 156/285 |
| 3,992,761 | 11/1976 | McElroy | 156/89 |
| 4,283,242 | 8/1981 | Regler et al. | 156/382 |
| 4,421,589 | 12/1983 | Armini et al. | 156/381 |

*Primary Examiner*—Donald E. Czaja
*Assistant Examiner*—J. Davis
*Attorney, Agent, or Firm*—Ostrolenk, Faber, Gerb & Soffen

[57] ABSTRACT

A plurality of ceramic green sheets each provided with electrodes are prepared and laminated to form a laminated unit. The laminated unit is then vacuum packed in a rubber covering or a synthetic resin sheet. The vacuum packed laminated unit is pressed by hydrostatic pressure within a high-pressure vessel, whereby the plurality of ceramic green sheets are pressed to form a single ceramic sheet, which is then baked to form a chip.

6 Claims, 3 Drawing Sheets

METHOD FOR MANUFACTURING MONOLITHIC CERAMIC ELECTRONIC COMPONENTS

BACKGROUND OF THE INVENTION

1. Field of the Invention

The present invention relates to a method for manufacturing monolithic ceramic electronic components. More specifically, the present invention relates to a method for manufacturing monolithic ceramic electronic components used for producing the electronic components such as a monolithic capacitor by laminating ceramic green sheets.

2. Description of the Prior Art

FIG. 10 illustrates a monolithic capacitor as one example of a monolithic ceramic electronic component forming part of the background of the present invention. The monolithic capacitor 1 includes a plurality of internal electrodes (not shown) within a ceramic unit 2, and on opposite ends thereof, a pair of external electrodes 3 are formed which are connected electrically to the internal electrodes.

For preparing such monolithic capacitor 1, the following method has been utilized hitherto. A plurality of rectangular electrodes are formed previously on a plurality of ceramic green sheets, which are then compressed by a pair of rigid press molds after being laminated. In the process of compression by the rigid press molds, the laminated green sheets are placed in the lower press mold, and then the green sheets and the internal electrodes are compressed together by pressing the upper press mold so as not to leave any gap between the various green sheets and electrodes. In this case, if there were any gap, a delamination might occur in a subsequent cutting or baking process, so a large pressure is required for pressing.

After lamination by pressing, the laminated green sheets are cut and chipped into the shape of rectangular parallelepipeds, and the external electrodes are formed on the opposite ends thereof after being baked.

Since the sheet thickness differs between the portions where the internal electrodes are formed and where they are not formed, when using the rigid press mold for compression, the molding density of the portions where the opposite internal electrodes are not superposed tends to remain low, so there is a problem in that delamination may easily occur in these portions. Particularly, the more the number of green sheet laminated increases, the larger the density difference in the pressing, thus exerting a great influence. Accordingly, when producing the multi-layer monolithic capacitor, the prior art process results easily in defective products due to the short pressing, thus considerably deteriorating the yield.

Moreover, since the pressing method by the rigid press molds causes distortion of the molds when applying the pressure, the acting force differs with the point of action of the upper and lower molds, thus resulting in a non-uniform pressure force which also causes the eventual delamination.

Furthermore, when compressing by the rigid press molds, since the chips or the ceramic units after baking are formed in the shape of generally perfect rectangular parallelepipeds, the external electrodes formed thereon may project outward from the ceramic unit due to their thickness, so that there is a problem in that their mounting characteristics on a substrate will be deteriorated.

SUMMARY OF THE INVENTION

Therefore, the principal object of the present invention is to provide a method for manufacturing monolithic ceramic electronic components, which is capable of improving the product yield without accompanying delamination, by compressing the laminated ceramic green sheets uniformly.

The present invention relates is a manufacturing method, in which when the ceramic green sheets provided with electrodes are laminated and compressed, the laminated unit of the ceramic green sheets being compressed by hydrostatic pressure after being vacuum packed.

According to the present invention, since the laminated green sheets can be compressed under uniform pressure by hydrostatic pressure, non-uniform pressure due to the difference of molding density between portions where the opposite electrodes are superposed and other portions can be solved and the delamination may be eliminated, thus improving the product yield considerably. Since uniform pressure can be obtained irrespective of the number of layers, a high yield of the multi-layer laminated electronic components may also be anticipated. Furthermore, as a result of the hydrostatic pressure, since portions with a small number of layers of the internal electrodes, when pressed, become thinner than portions with many layers of internal electrodes, then if the external electrodes are formed on these thinner portions, the undesirable outward projection of the external electrodes becomes smaller or zero, and thus the mounting characteristics on the substrate and stability in packaging may be improved.

These objects and other objects, features, aspects and advantages of the present invention will become more apparent from the following detailed description of a preferred embodiment of the present invention when taken in conjunction with accompanying drawings.

BRIEF DESCRIPTION OF THE DRAWINGS

FIG. 1 illustrates a process of hydrostatic pressing, FIG. 2 illustrates a process of forming a laminated unit of ceramic green sheets, FIG. 3 illustrates a process of vacuum packing of a laminated unit, FIG. 4 illustrates a laminated unit after being compressed, FIG. 5 illustrates a chip after being baked, and FIG. 6 illustrates a monolithic capacitor after being formed with electrodes.

DESCRIPTION OF THE PREFERRED EMBODIMENTS

Figure 1:
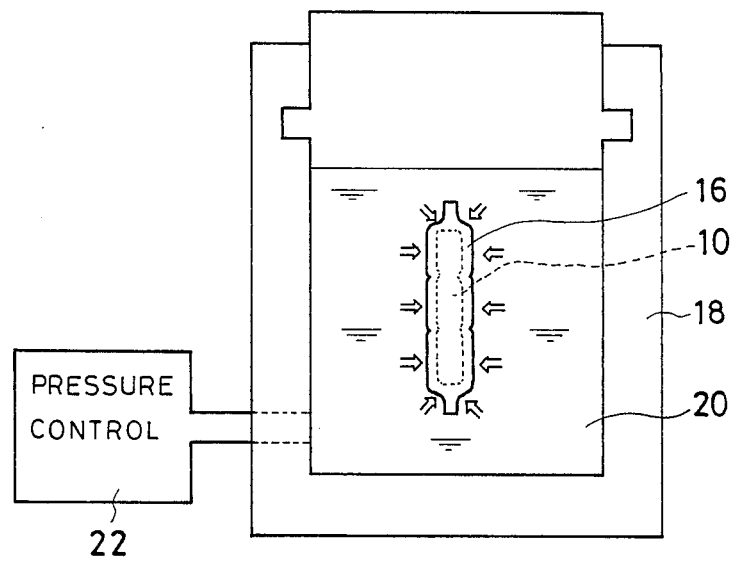
FIG. 1 through FIG. 6 are views successively illustrating the manufacturing process of the embodiment of the present invention, in which particularly.

FIG. 1 through FIG. 6 are views illustrating a process of manufacturing a monolithic capacitor according to one embodiment of the present invention, in which particularly, FIG. 1 is a schematic view illustrating a compressing process using hydrostatic pressure. As shown first in FIG. 2, a laminated unit 10 is prepared, in which a plurality of ceramic green sheets 14 each formed with internal electrodes 12a-12c are laminated. More specifically, the laminated unit 10 is prepared in the following manner; first a plurality of internal electrodes 121 are formed on the sheet 141. Similarly, pluralities of internal electrodes 122 and 123 are formed on the sheets 142 and 143, respectively. Then the sheets 141-143 are laminated so that each three corresponding internal electrodes 121-123 form a group, such as groups 12a, 12b, and 12c in FIG. 2. In each group, alternate electrodes are shifted slightly in lateral position. For example, in each of groups 12a-12c, the lateral position of internal electrodes 121 and 123 are shifted slightly to the left of internal electrode 122. Then a green sheet 144 having no electrode thereon is laminated on sheet 143 to complete the laminated unit 10.

Figure 2:
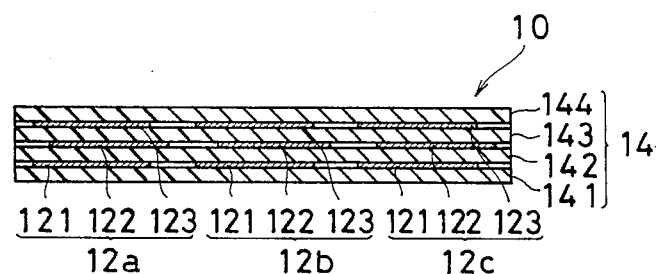

Thus, FIG. 2 shows three layers of internal electrodes 121, 122 and 123, four layers of green sheets 141-144 (these are collectively indicated by reference numeral 14 to indicate that a single green sheet 14 will be formed subsequently by compression), and three groups of internal electrodes 12a, 12b and 12c formed laterally in one laminated unit 10. However, the specific numbers of each of these components are optional. Moreover, green sheets not having electrodes may be laminated on either the top or the bottom surfaces, or both, of the laminated unit of FIG. 2.

Figure 3:
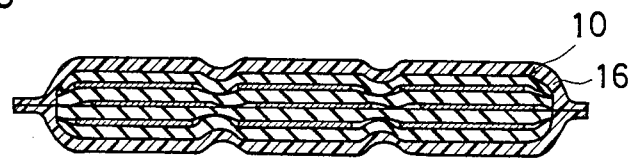

Then, the laminated unit 10 is vacuum packed in a flexible material 16, for example, such as rubber, as illustrated in FIG. 3. As a material for the flexible material 16, rubber or vinyl having a high water-tightness and adaptability to the shape of the material being compressed (the laminated unit of the ceramic green sheets) may be suitable. In such vacuum packed state, because of the negative pressure thereof, the portions where few or no internal electrodes 121-123 are present in underlying layers sink slightly as compared with the portions with internal electrodes present in many layers.

Now, the laminated unit 10 vacuum packed in the flexible material 16 is placed into a quantity of water or oil 20 within a high-pressure vessel 18 as illustrated in FIG. 1, and the hydrostatic pressure therein is raised by a pressure controller 22. The laminated unit 10 is thus pressurized uniformly on all surfaces thereof by water pressure through the flexible material 16, forming the green sheets 141-144 into a single green sheet 14. In other words, since the laminate 10 is pressurized and compressed entirely and uniformly on all parts of the green sheet 14 irrespective of whether a given portion has underlying internal electrodes in layers, few layers, or many layers, uneven molding density of the green sheet 14 can be eliminated. Then, the hydrostatic pressure inside the high-pressure vessel 18 is released by the pressure controller 22 after the laminated unit 10 has been compressed to any predetermined molding density.

Figure 4:
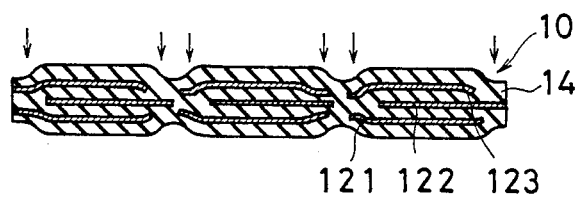

The laminated unit 10 is then taken out of the high-pressure vessel 18 and the flexible material 16 is stripped off. The laminated unit 10 after pressing is illustrated in FIG. 4. The pressed laminated unit 10 is cut and chipped at the points indicated by the arrow, that is, at the opposite outer ends of each group of the internal electrodes being shifted alternately.

Figure 5:
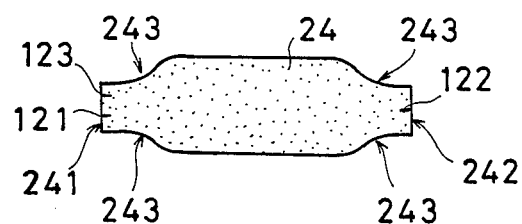
Figure 6:
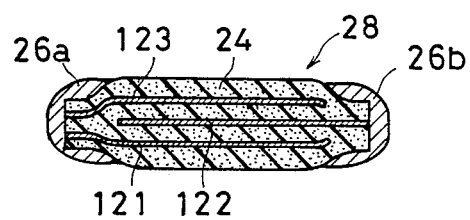

The laminated unit is then baked at a high temperature, forming a chip 24 as illustrated in FIG. 5. As it will be apparent from FIG. 5, the internal electrodes 121 and 123 of the chip 24 are exposed slightly at one end 241 thereof, while the internal electrode 122 is exposed at the other end 242. The portions of the chip 24 adjacent the opposite ends 241 and 242 form portions 243, which are constricted as compared with the central portion where the opposite internal electrodes 121-123 are superposed.

On the outer surfaces of the opposite ends 241 and 242 and the constricted portions 243 of the chip 24, external electrodes 26a and 26b are formed, for example, by coating and baking the electrode paste. The external electrode 26a is electrically connected to the internal electrodes 121 and 123 and the external electrode 26b to the internal electrode 122.

Figure 7:
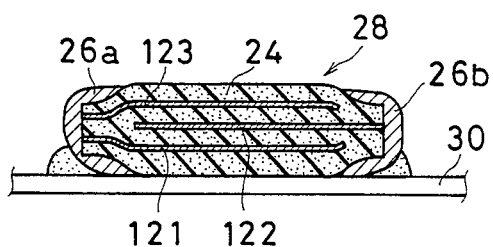
FIG. 7 is a sectional view illustrating a monolithic capacitor manufactured in accordance with the embodiment and mounted on a substrate.

In a monolithic capacitor 28 produced in such a manner, since the thickness of external electrodes 26a and 26b can be limited to generally the same level as that of the central portion of the chip 24. That is, the amount (height) the external electrodes 26a and 26b project beyond the central portion of the chip 24 becomes smaller or becomes zero, as illustrated in FIG. 7. Thus, a stable mounting state may be anticipated when the chip is mounted on a substrate 30, thus improving the mounting characteristics.

Figure 8:
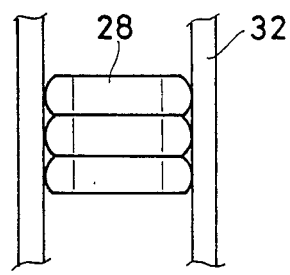
FIGS. 8 and 9 are views illustrating a packaged monolithic capacitor prepared in accordance with the embodiment.
Figure 9:
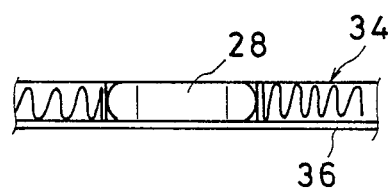

Moreover, packaging of a monolithic capacitor 28 manufactured as described above may be effected by feeding the capacitors into a magazine 32 as illustrated in FIG. 8, or into a tape body 34 as illustrated in FIG. 9.

Figure 10:
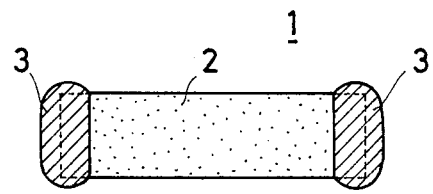
FIG. 10 is a view illustrating a monolithic capacitor forming the background of the present invention and prepared by the conventional rigid press molds.

In the case of feeding a plurality of monolithic capacitors 1 produced by conventional rigid press molds as illustrated in FIG. 10 into a magazine 32, since the external electrodes 3 are projected from the upper and lower surfaces of the ceramic unit 2, gaps between each pair of monolithic capacitors 1 may occur, which will cause obstruction by the inner wall of the magazine 32 and shift the alignment, and thus it is sometimes difficult to take the parts out smoothly. However, since the projection amount of the external electrodes becomes very much smaller in the monolithic capacitor 28 according to the present invention, then even when a plurality of capacitors are fed into the magazine 32 in piles, the alignment will not be shifted, so there is no problem in taking out the same.

Furthermore, packaging of the monolithic capacitor 28 may be effected by inserting it into a cavity of a tape body 34 as illustrated in FIG. 9, and sticking the capacitor to an adhesive tape 36 which in turn is stuck to the tape body 34. In the case of the monolithic capacitor 1 illustrated in FIG. 10, only the external electrodes 3 are stuck onto the adhesive tape 36, resulting in a risk of detachment and shifting during the transportation. However, in the case of the monolithic capacitor 28 manufactured according to the embodiment of the invention, not only the external electrodes 26a and 26b but also the central portion of the chip 24 can be stuck sufficiently onto the adhesive tape 36, so that any detachment during transportation may be eliminated.

In the above described embodiment, although the case of manufacturing a number of monolithic capacitors simultaneously is shown, the present invention may naturally be applied to the case of producing capacitors one by one.

Moreover, the electronic components to be manufactured are not limited to the monolithic capacitor only.

Although an embodiment of the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for manufacturing monolithic ceramic electronic components, comprising the following steps:
   (a) (i) laminating a plurality of ceramic green sheets and a plurality of internal electrodes, to form a laminated unit, wherein said green sheets form alternating layers and said electrodes at least partially overlap one another,
   (a) (ii) defining a plurality of discrete laminated stacks within said laminated unit by providing a respective dividing portion in each of said ceramic green sheets, said dividing portions having no electrodes therebetween, said dividing portions being at corresponding points in said laminated unit for defining dividing lines through the thickness of said laminated unit,
   (b) vacuum packing said laminated unit in a flexible and vacuum-tight covering,
   (c) pressing said laminated unit vacuum packed in said covering with hydrostatic pressure exerted simultaneously from at least two sides of said laminated unit, and thereby compressing said laminated unit to a greater extent at said dividing lines than at other portions of said laminated unit, and then
   (d) removing said covering from said laminated unit;
   (e) baking said laminated unit; and
   (f) cutting said discrete stacks apart at said dividing lines to form chips which are thinner at their ends than at central portions thereof.

2. A method for manufacturing monolithic ceramic electronic components in accordance with claim 1, which further comprises providing external electrodes on each baked laminated unit.

3. A method as in claim 1, wherein step (c) includes pressing said laminated unit with hydrostatic pressure by placing said laminated unit, vacuum packed in said covering, in a quantity of a liquid pressure medium within a high-pressure vessel and raising the hydrostatic pressure in said high-pressure vessel.

4. A method as in claim 1, wherein step (c) includes exerting such hydrostatic pressure simultaneously on substantially all surfaces of said laminated unit.

5. A method as in claim 2, including forming said electrodes on said thinner ends of said chips so that the thickness of the ends of the chips, including the electrodes, is no greater than the thickness of the central portions of the chips.

6. A method as in claim 1, wherein said flexible and vacuum-tight material is selected from rubber and vinyl materials.

* * * * *